(12) United States Patent
Park et al.

(10) Patent No.: US 9,872,386 B2
(45) Date of Patent: Jan. 16, 2018

(54) COMPOSITION FOR FORMING CONDUCTIVE PATTERN, METHOD FOR FORMING CONDUCTIVE PATTERN USING SAME, AND RESIN STRUCTURE HAVING CONDUCTIVE PATTERN

(71) Applicant: LG CHEM, LTD., Seoul (KR)

(72) Inventors: Chee-Sung Park, Daejeon (KR); Cheol-Hee Park, Daejeon (KR); Ha Na Lee, Daejeon (KR); Han Nah Jeong, Daejeon (KR); Jae Hyun Kim, Daejeon (KR); Shin Hee Jun, Daejeon (KR); Eun Kyu Seong, Daejeon (KR); Su Jeong Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/503,637

(22) PCT Filed: Sep. 1, 2015

(86) PCT No.: PCT/KR2015/009195
§ 371 (c)(1),
(2) Date: Feb. 13, 2017

(87) PCT Pub. No.: WO2016/039548
PCT Pub. Date: Mar. 17, 2016

(65) Prior Publication Data
US 2017/0273182 A1    Sep. 21, 2017

(30) Foreign Application Priority Data

Sep. 11, 2014 (KR) ........................ 10-2014-0120234

(51) Int. Cl.
*H05K 1/09* (2006.01)
*H05K 1/03* (2006.01)
(Continued)

(52) U.S. Cl.
CPC ................ *H05K 1/09* (2013.01); *C08J 7/123* (2013.01); *C08K 3/22* (2013.01); *C23C 18/1612* (2013.01);
(Continued)

(58) Field of Classification Search
CPC .......... H05K 1/09; H05K 1/092; H05K 1/095; H05K 1/097
See application file for complete search history.

(56) References Cited

U.S. PATENT DOCUMENTS

2004/0241422 A1    12/2004   Naundorf et al.
2011/0281135 A1    11/2011   Gong et al.
(Continued)

FOREIGN PATENT DOCUMENTS

CN    101278607 A    10/2008
CN    101747650 A    6/2010
(Continued)

*Primary Examiner* — Jeremy C Norris
(74) *Attorney, Agent, or Firm* — Dentons US LLP

(57) ABSTRACT

The present invention relates to a composition for forming a conductive pattern which allows micro conductive patterns to be formed on various polymeric resin products or resin layers by a very simplified process, a method for forming a conductive pattern using the composition, and a resin structure having the conductive pattern. The composition for forming a conductive pattern comprises: a polymeric resin; and a nonconductive metallic compound including a first metal, a second metal and a third metal, wherein the nonconductive metallic compound has a three-dimensional structure including a plurality of first layers (edge-shared octahedral layers) having a structure in which octahedrons comprising two metals from among the first metal, the second metal and the third metal which share the edges thereof with one another are two-dimensionally connected to one other, and a second layer which includes a metal of a different type from the first layer and is arranged between (Continued)

adjacent first layers, and wherein a metallic core including the first metal, the second metal or the third metal or an ion thereof is formed from the nonconductive metallic compound by electromagnetic radiation.

15 Claims, 5 Drawing Sheets

(51) Int. Cl.
    *H05K 3/10*     (2006.01)
    *H05K 3/18*     (2006.01)
    *C08K 3/22*     (2006.01)
    *C08J 7/12*     (2006.01)
    *C23C 18/16*     (2006.01)
    *C23C 18/20*     (2006.01)

(52) U.S. Cl.
    CPC ........ *C23C 18/1641* (2013.01); *C23C 18/204* (2013.01); *C23C 18/2013* (2013.01); *H05K 1/0353* (2013.01); *H05K 3/105* (2013.01); *H05K 3/181* (2013.01); *C08J 2369/00* (2013.01); *C08K 2003/2248* (2013.01); *C08K 2003/2293* (2013.01); *H05K 2201/032* (2013.01)

(56) References Cited

U.S. PATENT DOCUMENTS

| | | |
|---|---|---|
| 2012/0279764 A1 | 11/2012 | Jiang et al. |
| 2013/0106659 A1 | 5/2013 | Yung et al. |
| 2013/0136869 A1 | 5/2013 | Hamilton et al. |
| 2016/0174370 A1 | 6/2016 | Park et al. |
| 2016/0295704 A1 | 10/2016 | Park et al. |

FOREIGN PATENT DOCUMENTS

| | | |
|---|---|---|
| CN | 102066122 A | 5/2011 |
| CN | 103053227 A | 4/2013 |
| KR | 10-2004-0021614 A | 3/2004 |
| KR | 10-0716486 B1 | 5/2007 |
| KR | 10-2011-0112860 A | 10/2011 |
| KR | 10-1377273 B1 | 3/2014 |
| KR | 10-1434423 B1 | 8/2014 |
| KR | 10-2014-0128233 A | 11/2014 |
| KR | 10-2014-0128234 A | 11/2014 |

COMPOSITION FOR FORMING CONDUCTIVE PATTERN, METHOD FOR FORMING CONDUCTIVE PATTERN USING SAME, AND RESIN STRUCTURE HAVING CONDUCTIVE PATTERN

CROSS-REFERENCE TO RELATED APPLICATION

This application is a National Stage Application of International Application No. PCT/KR2015/009195 filed on Sep. 1, 2015, which claims the benefit of Korean Patent Application No. 10-2014-0120234 filed on Sep. 11, 2014, all of which are hereby incorporated by reference in their entirety for all purposes as if fully set forth herein.

TECHNICAL FIELD

The present invention relates to a composition for forming a conductive pattern, which enables formation of a fine conductive pattern onto a variety of polymer resin products or resin layers by a very simplified process, a method of forming the conductive pattern using the same, and a resin structure having the conductive pattern.

BACKGROUND ART

With the recent development of microelectronic technology, a need for structures having a fine conductive pattern which is formed on the surface of a polymer resin substrate (or product) such as a variety of resin products or resin layers has grown. The conductive pattern on the surface of the polymer resin substrate and the structures may be applied to form various objects such as circuits integrated into an electronic device case, antennas, a variety of sensors, MEMS structures, RFID tags, etc.

As described above, with increasing interest in the technology of forming the conductive pattern on the surface of the polymer resin substrate, several technologies regarding this were suggested. However, a method capable of more effectively using these technologies has not been suggested yet.

For example, according to the previously known technology, a method of forming the conductive pattern by forming a metal layer on the surface of the polymer resin substrate and then applying photolithography, or a method of forming the conductive pattern by printing a conductive paste may be considered. However, when the conductive pattern is formed according to this technology, there are disadvantages that a process or equipment to be needed becomes too complicated, or it is difficult to form a superior fine conductive pattern.

Accordingly, there is a continuous need to develop a technology capable of more effectively forming the fine conductive pattern on the surface of the polymer resin substrate by a simplified process.

DISCLOSURE

Technical Problem

The present invention provides a composition for forming a conductive pattern, which enables formation of a fine conductive pattern onto a variety of polymer resin products or resin layers by a very simplified process, and a method of forming the conductive pattern using the same.

Further, the present invention provides a resin structure having a conductive pattern, which is formed from the composition for forming the conductive pattern, etc.

Technical Solution

The present invention provides a composition for forming a conductive pattern by electromagnetic irradiation, the composition including a polymer resin; and a non-conductive metal compound including a first metal, a second metal, and a third metal, the non-conductive metal compound having a three-dimensional structure including a plurality of first layers that includes two metals of the first metal, the second metal, and the third metal and has edge-shared octahedrons two-dimensionally connected to each other, and a second layer that includes a metal different from that of the first layer and is arranged between the neighboring first layers, in which a metal core including the first metal, second metal, or third metal, or an ion thereof is formed from the non-conductive metal compound by electromagnetic irradiation.

In the composition for forming the conductive composition, the metals included in the second layer of the non-conductive metal compound may connect the two-dimensional structures to each other, for example, by connecting vertices of the octahedrons to each other between the neighboring first layers. This non-conductive metal compound may be defined as a compound having a space group of $R\overline{3}m$ or $P6_3/mmc$.

Specifically, the non-conductive metal compound may include one or more non-conductive metal compounds represented by the following Chemical Formula 1:

$$A_3(BC_2)X_6 \qquad \text{[Chemical Formula 1]}$$

wherein A, B and C represent each independently the first metal, the second metal, and the third metal, A is one or more metals selected from the group consisting of Cu, Ag and Au, B is one or more metals selected from the group consisting of Ni, Co and Fe, C is V, and X is oxygen, nitrogen, or sulfur.

More specifically, the non-conductive metal compound may include one or more compounds selected from the group consisting of $Cu_3(NiV_2)O_6$, $Ag_3(NiV_2)O_6$, $Au_3(NiV_2)O_6$, $Cu_3(CoV_2)O_6$, $Cu_3(FeV_2)O_6$, $Ag_3(CoV_2)O_6$, $Ag_3(FeV_2)O_6$, $Au_3(CoV_2)O_6$ and $Au_3(FeV_2)O_6$.

With regard to the above-described composition for forming the conductive pattern, the polymer resin may include a thermosetting resin or a thermoplastic resin, and more specific examples thereof may include an acrylonitrile-butadiene-styrene (ABS) resin, a polyalkyleneterephthalate resin, a polycarbonate resin, a polypropylene resin, polyphthalamide, nylon, an elastomer resin, etc.

Further, with regard to the composition for forming the conductive pattern, the non-conductive metal compound may be included in an amount of approximately 1 to 10% by weight, based on the total composition, and the polymer resin may be included in the remaining amount.

The composition for forming the conductive pattern may further include one or more additives selected from the group consisting of a heat stabilizer, a UV stabilizer, a flame retardant, a lubricant, an antioxidant, an inorganic filler, a color additive, an impact modifier, and a functional modifier, in addition to the above-described polymer resin and the predetermined non-conductive metal compound.

The color additive is a substance which is added in order to impart a color to the above-described composition for forming the conductive pattern, if necessary, and one or more inorganic pigments selected from the group consisting of carbon black, graphite, graphene, clay, talc, $TiO_2$, $ZrO_2$, $Fe_2O_3$, $BaSO_4$, $CaCO_3$, $SiO_2$, ZnS, ZnO, $ZnCrO_4$, $Cr_2O_3$, $CoO.nAl_2O_3$ and $Co_3(PO_4)_2$; or one or more organic pigments selected from the group consisting of copper phthalocyanine and quinacridone may be used.

Meanwhile, the present invention also provides a method of forming a conductive pattern on a polymer resin substrate such as a resin product or a resin layer by direct electromagnetic irradiation using the above-described composition for forming the conductive pattern. The method of forming the conductive pattern may include molding the above-described composition for forming the conductive pattern to a resin product or applying it to another product to form a resin layer; irradiating an electromagnetic wave to a predetermined region of the resin product or the resin layer to generate a metal core including the first metal, second metal, or third metal, or the ion thereof from the non-conductive metal compound; and chemically reducing or plating the region generating the metal core to form the conductive metal layer.

In the generating of the metal core of the above method of forming the conductive pattern, a laser electromagnetic wave having various wavelengths ranging from approximately 200 nm to approximately 11,000 nm may be irradiated at an average power of approximately 3 W to approximately 20 W, and as a result, the metal core may be more effectively formed and a more excellent conductive pattern may be formed.

Further, when the generating of the metal core by electromagnetic irradiation is carried out, the non-conductive metal compound is partially exposed on the surface of the predetermined region of the resin product or the resin layer, and the metal core is generated therefrom, thereby forming a surface (hereinafter, "adhesion-activated surface") which is activated to have higher adhesion. Subsequently, conductive metal ions are chemically reduced by chemical reduction of the first, second, or third metal ion included in the metal core or by electroless plating thereof, and thus the conductive metal layer may be formed on the adhesion-activated surface. At the time of the electroless plating, the metal cores may function as a kind of seed to form a strong bond with the conductive metal ions in a plating solution when the conductive metal ions are chemically reduced. As a result, the conductive metal layer may be selectively formed in an easier manner.

Further, in the reducing or plating, the predetermined region of the resin product or resin layer on which the metal core is generated may be treated with an acidic or basic solution including a reducing agent, and this solution may include one or more selected from the group consisting of formaldehyde, hypophosphite, dimethylamino borane (DMAB), diethylamino borane (DEAB), and hydrazine as the reducing agent. In another embodiment, in the reducing, the predetermined region may be treated with an electroless plating solution including a reducing agent and a conductive metal ion.

Meanwhile, the present invention also provides a resin structure having the conductive pattern which is obtained by using the composition for forming the conductive pattern and the method of forming the conductive pattern as described above. The resin structure may include the polymer resin substrate; the non-conductive metal compound that includes the first metal, the second metal, and the third metal, and is dispersed in the polymer resin substrate, the non-conductive metal compound having a three-dimensional structure including a plurality of first layers (edge-shared octahedral layer) that includes two metals of the first metal, the second metal, and the third metal and has edge-shared octahedrons two-dimensionally connected to each other, and a second layer that includes a metal different from that of the first layer and is arranged between the neighboring first layers; the adhesion-activated surface having a metal core including the first metal, second metal or third metal, or the ion thereof which is exposed on the surface of the predetermined region of the polymer resin substrate; and the conductive metal layer formed on the adhesion-activated surface.

In the resin structure, the predetermined region where the adhesion-activated surface and the conductive metal layer are formed may correspond to the region of the polymer resin substrate to which an electromagnetic wave is irradiated.

Effect of the Invention

According to the present invention, provided are a composition for forming a conductive pattern, which enables more effective formation of a fine conductive pattern on a polymer resin substrate such as a variety of polymer resin products or resin layers by a very simplified process of laser electromagnetic irradiation, a method of forming the conductive pattern using the same, and a resin structure having the conductive pattern.

The composition for forming the conductive pattern or the method of forming the conductive pattern is used to very effectively form conductive patterns for antenna on a variety of resin products, such as an electronic device case, RFID tags, various sensors, MEMS structures or the like.

DETAILED DESCRIPTION OF THE EMBODIMENTS

Hereinafter, a composition for forming a conductive pattern, a method of forming the conductive pattern using the same, and a resin structure having the conductive pattern according to specific embodiments of the present invention will be described.

According to one embodiment of the present invention, provided is a composition for forming a conductive pattern by electromagnetic irradiation, the composition including a polymer resin; and a non-conductive metal compound including a first metal, a second metal, and a third metal, the non-conductive metal compound having a three-dimensional structure including a plurality of first layers (edge-shared octahedral layers) that includes two metals of the first metal, the second metal, and the third metal and has edge-shared octahedrons two-dimensionally connected to each other, and a second layer that includes a metal different from that of the first layer and is arranged between the neighboring first layers, in which a metal core including the first metal, second metal or third metal, or an ion thereof is formed from the non-conductive metal compound by electromagnetic irradiation.

After molding a polymer resin product or a resin layer by using the composition for forming the conductive pattern according to one embodiment of the present invention, metal cores including the first metal, second metal or third metal, or the ion thereof may be formed from the non-conductive metal compound by laser electromagnetic irradiation. These metal cores are selectively exposed on a predetermined region to which an electromagnetic wave is irradiated, and thus an adhesion-activated surface may be formed on the surface of the polymer resin substrate. Subsequently, by chemical reduction of the metal core including the first metal, second metal or third metal, or the ion thereof or by electroless plating using the metal cores as a seed and a plating solution containing the conductive metal ions, a conductive metal layer may be formed on the adhesion-activated surface including the metal cores. Through this process, the conductive metal layer, namely, fine conductive pattern may be selectively formed only on the predetermined region of the polymer resin substrate, to which the electromagnetic wave is irradiated.

In particular, one of factors causing formation of the metal cores and the adhesion-activated surface and formation of the superior conductive pattern by electromagnetic irradiation may be the specific three-dimensional structure of non-conductive metal compound included in the composition of one embodiment. An exemplary three-dimensional structure of the non-conductive metal compound included in the composition for forming the conductive pattern according to one embodiment of the present invention is illustrated in FIG. 1.

Figure 1:
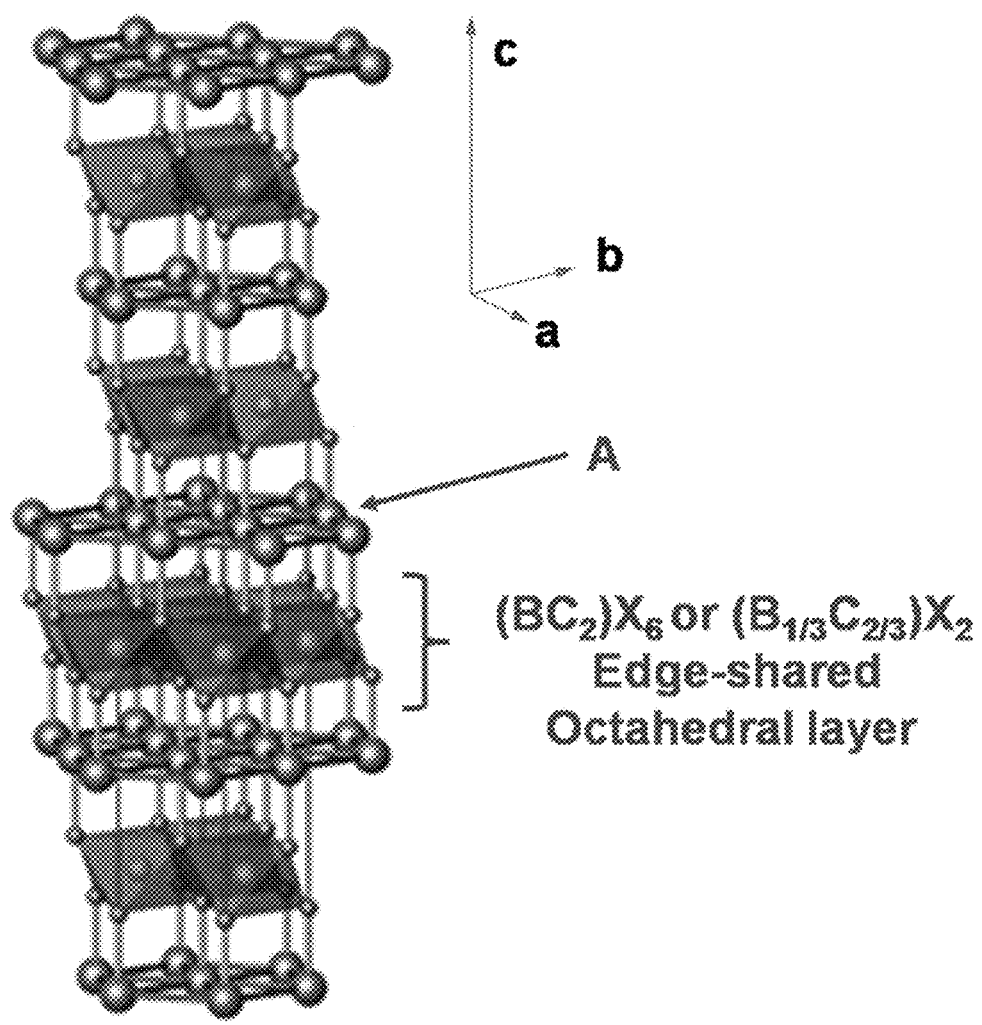
FIG. 1 illustrates an exemplary three-dimensional structure of a non-conductive metal compound which is included in a composition for forming a conductive pattern according to one embodiment of the present invention.

Referring to FIG. 1, in the three-dimensional structure of non-conductive metal compound, two or more metals of the first metal, second metal, and third metal constituting the three-dimensional structure are included in the first layer (edge-shared octahedral layer) which has edge-shared octahedrons two-dimensionally connected to each other. The atomic fractions of the two metals included in the first layer are $\frac{1}{3}$ and $\frac{2}{3}$, and they may form octahedrons to be distributed in a plurality of first layers.

In addition, the three-dimensional structure of non-conductive metal compound includes the second layer that is arranged between the neighboring first layers, together with a plurality of the above-described first layers. The second layer includes a metal different from that of the first layer, for example, the metal other than one of the first, second, and third metals which is included in the first layer, and the metals of the second layer connect vertices of the octahedrons to each other between the neighboring first layers, thereby connecting two-dimensional structures thereof to each other.

Before electromagnetic irradiation, the non-conductive metal compound having the particular layered three-dimensional structure exhibits non-conductivity and has excellent compatibility with the polymer resin, and also is chemically stable in the solution used in reduction or plating treatment so as to maintain non-conductivity. Therefore, the non-conductive metal compound is uniformly dispersed in the polymer resin substrate and maintains chemically stable state to exhibit non-conductivity in the region to which electromagnetic wave is not irradiated.

In contrast, the first, second or third metal, or ion thereof may be easily generated from the non-conductive metal compound in the predetermined region to which electromagnetic wave such as a laser is irradiated. In this regard, it is expected that easy generation of the metal or ion thereof from the non-conductive metal compound is attributed to the layered three-dimensional structure resulting from the sequential arrangement of the first layer and the second layer in the non-conductive metal compound. Since the non-conductive metal compound having the layered three-dimensional structure including the three metals has lower vacancy formation energy of the second layer than a compound having a different layered or non-layered three-dimensional structure, the first, second or third metal or the ion thereof contained in the second layer may be more easily released. As such, the metal or the ion thereof is more easily released from the non-conductive metal compound by electromagnetic irradiation, leading to easy formation of the metal cores and the adhesion-activated surface.

Further, since the non-conductive metal compound has a complex structure, in which the first layer includes the two metals of atomic fractions of $\frac{1}{3}$ and $\frac{2}{3}$, respectively, in addition to the layered three-dimensional structure resulting from the sequential arrangement of the first layer and the second layer, formation of the metal core and the adhesion-activated surface by electromagnetic irradiation is very easy. More specifically, the non-conductive metal compound may more easily form the metal core and the adhesion-activated surface by laser electromagnetic irradiation than a compound having a plurality of first layers composed of one metal.

Therefore, due to the above-described unique three-dimensional structure of the non-conductive metal compound and combination of the metal components constituting the unique three-dimensional structure, the composition for forming the conductive pattern of one embodiment is able to easily form a superior fine conductive pattern, compared to other composition including a compound which has the same structure as the non-conductive metal compound but has a first layer composed of a single metal, or a compound having a different three-dimensional structure such as spinel, etc., or other composition without metal core formation. Furthermore, owing to these features, the composition for forming the conductive pattern of one embodiment is able to more readily form a superior fine conductive metal layer, compared to other composition including a compound which has the same structure as the non-conductive metal compound but has a first layer composed of a single metal, or a non-conductive metal compound having a non-layered three-dimensional structure such as spinel, etc., even though the amount of the non-conductive metal compound, more specifically, the amount or content of the first metal, second metal or third metal is reduced.

Additionally, the above-described non-conductive metal compound included in the composition for forming the conductive pattern of an embodiment is able to produce a product or a resin layer having many different colors including black by addition of a pigment, a dye, etc. Therefore, the composition for forming the conductive pattern of an embodiment may be used to produce a product or a resin layer having the conductive pattern and having many different colors.

As such, when the composition for forming the conductive pattern according to one embodiment of the present invention is used, a superior fine conductive pattern may be easily formed on the polymer resin substrate by a very simple process of including laser electromagnetic irradiation and reduction or plating treatment of the corresponding region. Moreover, owing to the unique three-dimensional structure of the non-conductive metal compound and the complex solid solution included therein, the conductive pattern may be more effectively and easily formed, and resin products or resin layers having many different colors may be properly produced to meet consumers' demand Therefore, the composition for forming the conductive pattern is applied to very effectively form a conductive pattern for an electronic device on a variety of polymer resin products or resin layers, RFID tags, various sensors, MEMS structures, etc.

In the composition for forming the conductive pattern of one embodiment, the three-dimensional structure of the non-conductive metal compound may be a layered three-dimensional structure which is defined as a space group of R$\bar{3}$m or P6$_3$/mmc. Due to the layered three-dimensional structure, vacancy formation energy of the second layer may be further lowered, compared to non-layered three-dimensional structure. Therefore, the metal or ion thereof included in the second layer may be more easily released. Further, the non-conductive metal compound has a layered structure of a complex solid solution composed of three metal cations and one anion, the non-conductive metal compound having a complex structure formed by a plurality of first layers including two metals of atomic fractions of ⅓ and ⅔, respectively, and a structure formed by a second layer including the other one metal, thereby showing higher absorption and sensitivity with respect to electromagnetic wave such as a laser with a particular wavelength, etc. Therefore, use of the composition including the non-conductive metal compound having the layered three-dimensional structure and the particular combination of metal components may be one of main factors causing effective formation of metal cores and conductive metal layer (conductive pattern) while reducing the amount of the non-conductive metal compound.

In this regard, the non-conductive metal compound having the layered three-dimensional structure may include a compound represented by the following Chemical Formula 1, and the compound of Chemical Formula 1 may have the three-dimensional structure illustrated in FIG. 1.

$$A_3(BC_2)X_6 \quad \text{[Chemical Formula 1]}$$

wherein A, B and C represent each independently the first metal, the second metal, and the third metal, A is one or more metals selected from the group consisting of Cu, Ag and Au, B is one or more metals selected from the group consisting of Ni, Co and Fe, C is V, and X is oxygen, nitrogen, or sulfur.

Referring to FIG. 1, in the layered three-dimensional structure, B metal and C metal form octahedrons with X atoms at atomic fractions of ⅓ and ⅔, respectively, and octahedrons share edges to be arranged in the two-dimensionally connected structure, thereby forming the first layer (edge-shared octahedral layer). In the three-dimensional structure, A metal is arranged between the neighboring first layers to form the second layer. A metal constituting the second layer connect the vertices of the octahedrons of the first layer to each other, thereby connecting the two-dimensional structures to each other.

In this regard, A metal constituting the second layer may be one or more metals selected from the group consisting of Cu, Ag and Au, and may be a metal source released from the non-conductive metal compound by electromagnetic irradiation, B metal may be one or more metals selected from the group consisting of Ni, Co and Fe, and C metal may be vanadium (V).

In a more specific embodiment, it was found that among the non-conductive metal compounds having the above-described layered three-dimensional structure, one or more compounds selected from the group consisting of Cu$_3$(NiV$_2$)O$_6$, Ag$_3$(NiV$_2$)O$_6$, Au$_3$(NiV$_2$)O$_6$, Cu$_3$(CoV$_2$)O$_6$, Cu$_3$(FeV$_2$)O$_6$, Ag$_3$(CoV$_2$)O$_6$, Ag$_3$(FeV$_2$)O$_6$, Au$_3$(CoV$_2$)O$_6$ and Au$_3$(FeV$_2$)O$_6$ are used to more effectively form the metal core and the adhesion-activated surface including the same. Therefore, by using the particular non-conductive metal compound, the metal cores may be properly formed and the superior conductive pattern may be formed.

Further, in the above-described composition for forming the conductive pattern of one embodiment, any thermosetting resin or thermoplastic resin capable of forming various polymer resin products or resin layers may be used as the polymer resin without limitation. In particular, the non-conductive metal compound having the above-described particular three-dimensional structure may exhibit excellent compatibility and uniform dispersibility with respect to various polymer resins, and the composition of one embodiment may include various polymer resins and may be molded to various resin products or resin layers. Specific examples of the polymer resin may include an acrylonitrile-butadiene-styrene (ABS) resin, a polyalkyleneterephthalate resin, a polycarbonate resin, a polypropylene resin, a polyphthalamide resin, nylon, an elastomer, etc., and the polyalkyleneterephthalate resin may include, for example, a polybutyleneterephthalate resin, a polyethyleneterephthalate resin, etc. The polymer resin may include various polymer resins in addition to the above-described resins.

Further, in the composition for forming the conductive pattern, the non-conductive metal compound may be included in an amount of approximately 1% by weight to approximately 10% by weight, or approximately 1.5% by weight to approximately 7% by weight, based on the total composition, and the polymer resin may be included in the remaining amount. When the content is within the above range, the polymer resin product or the resin layer formed from the composition properly maintains the basic physical properties such as mechanical properties, and the conductive pattern is also preferably formed on a predetermined region by electromagnetic irradiation. Further, formation of the metal cores and the superior conductive pattern may be more preferably ensured by the above composition ratio.

Additionally, the composition of one embodiment includes the non-conductive metal compound having the particular three-dimensional structure formed by the particular combination of the metals and enables formation of metal cores or the like, thereby more effectively forming the conductive pattern by electromagnetic irradiation even though the composition includes a lower amount of non-conductive metal compound. Therefore, owing to the lower content of the non-conductive metal compound, it is easier to maintain excellent basic physical properties of the resin product or the resin layer.

The composition for forming the conductive pattern may further include one or more additives selected from the group consisting of a heat stabilizer, a UV stabilizer, a flame retardant, a lubricant, an antioxidant, an inorganic filler, a color additive, an impact modifier, and a functional modifier, in addition to the above-described polymer resin and the predetermined non-conductive metal compound. The color additive is a material added as needed in order to impart a color to the above-described composition for forming a conductive pattern, and one or more inorganic pigments selected from the group consisting of carbon black, graphite, graphene, clay, talc, $TiO_2$, $ZrO_2$, $Fe_2O_3$, $BaSO_4$, $CaCO_3$, $SiO_2$, ZnS, ZnO, $ZnCrO_4$, $Cr_2O_3$, $CoO.nAl_2O_3$ and $Co_3(PO_4)_2$; one or more organic pigments selected from the group consisting of copper phthalocyanine and quinacridone; or the like may be used. Various other additives known to be usable in the composition for molding the resin product may be also used without limitation.

Meanwhile, according to another embodiment of the present invention, provided is a method of forming the conductive pattern on the polymer resin substrate such as the resin product or the resin layer by direct electromagnetic irradiation using the above-described composition for forming the conductive pattern. The method of forming the conductive pattern may include molding the above-described composition for forming the conductive pattern to a resin product or applying it to another product to form a resin layer; irradiating an electromagnetic wave to a predetermined region of the resin product or the resin layer to generate a metal core including the first metal, second metal or third metal, or the ion thereof from the non-conductive metal compound; and chemically reducing or plating the region generating the metal core to form the conductive metal layer.

Hereinafter, each step of the method of forming the conductive pattern according to another embodiment will be described with reference to the accompanying drawings. For reference, FIG. 2 illustrates a schematic diagram showing each step of an exemplary method of forming the conductive pattern, and FIG. 3 is an electron microscopic image showing formation of an adhesion-activated surface including a metal core on the surface of the polymer resin substrate by electromagnetic irradiation in the exemplary method of forming the conductive pattern.

In the method of forming the conductive pattern, first, the above-described composition for forming the conductive pattern is molded to the resin product or is applied to another product to form the resin layer. In the molding of the resin product or in the forming of the resin layer, a method of molding a product or a method of forming a resin layer using a general polymer resin composition may be applied without limitation. For example, when the resin product is molded using the composition, the composition for forming the conductive pattern is extruded and cooled to form pellets or particles, which are subjected to injection-molding in a desired shape, thereby manufacturing a variety of polymer resin products.

The polymer resin product or the resin layer thus formed may have the above described non-conductive metal compound of the particular three-dimensional structure formed by the above-described particular combination of the metals, which is uniformly dispersed on the resin substrate formed from the polymer resin. In particular, since the non-conductive metal compound has excellent compatibility, sufficient solubility, and chemical stability for various polymer resins, the non-conductive metal compound is uniformly dispersed throughout the resin substrate while maintaining non-conductivity.

Figure 2:
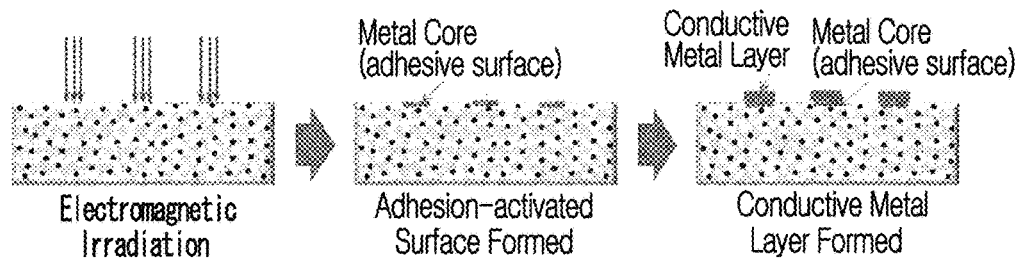
FIG. 2 illustrates a schematic diagram showing each step of an exemplary method of forming a conductive pattern using the composition according to one embodiment of the present invention.
Figure 3:
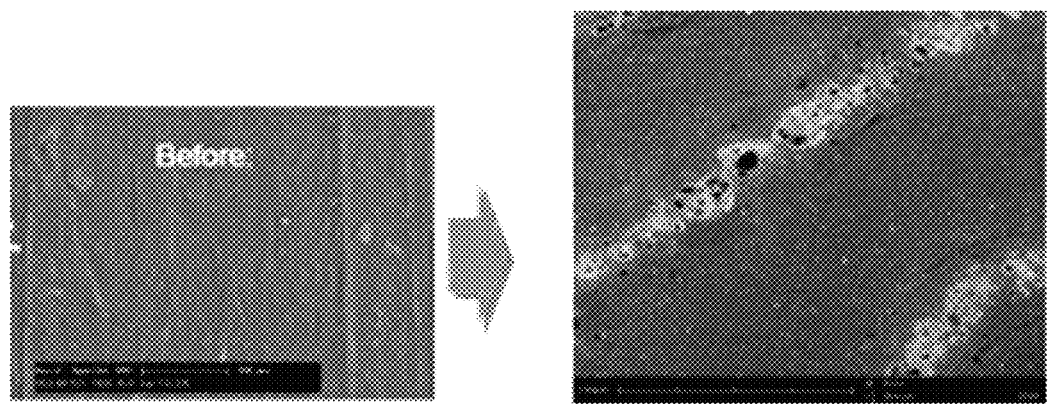
FIG. 3 is an electron microscopic image showing formation of an adhesion-activated surface including a metal core on the surface of the polymer resin substrate by electromagnetic irradiation in the exemplary method of forming the conductive pattern using the composition according to one embodiment of the present invention.

After forming the polymer resin product or the resin layer, as illustrated in the first figure of FIG. 2, an electromagnetic wave such as laser, etc. may be irradiated to a predetermined region of the resin product or the resin layer, on which the conductive pattern is intended to be formed. When the electromagnetic wave is irradiated, the first metal, second metal or third metal or the ion thereof may be released from the non-conductive metal compound, and metal cores including the same may be generated (see the second figure of FIG. 2).

More specifically, when the generating of the metal cores by electromagnetic irradiation is carried out, part of the non-conductive metal compound is exposed on the surface of the predetermined region of the resin product or the resin layer, and metal cores are generated therefrom, and thus the adhesion-activated surface which is activated to have higher adhesion may be formed. Since the adhesion-activated surface is selectively formed on the specific region to which the electromagnetic wave is irradiated, the conductive metal layer may be selectively formed on the predetermined region of the polymer resin substrate more favorably, when conductive metal ions are chemically reduced by chemical reduction of the first metal, second metal, or third metal ions included in the metal core and the adhesion-activated surface, or electroless plating thereof in the reduction or plating step described below. More specifically, upon electroless plating, the metal cores function as a kind of seed to form a strong bond with the conductive metal ions included in the plating solution, when the conductive metal ions are chemically reduced. As a result, a superior conductive metal layer may be selectively formed in an easier manner.

Meanwhile, in the generating of the metal cores, a laser electromagnetic wave among electromagnetic waves may be irradiated, for example, a laser electromagnetic wave having a variety of wavelengths between 200 nm to 11000 nm in the infrared region may be irradiated. Specifically, in the generating of the metal cores, a laser electromagnetic wave having a wavelength of approximately 248 nm, approximately 308 nm, approximately 355 nm, approximately 532 nm, approximately 585 nm, approximately 755 nm, approximately 1064 nm, approximately 1550 nm, approximately 2940 nm or approximately 10600 nm may be irradiated at an average power of approximately 3 W to approximately 20 W, approximately 4 W to approximately 20 W, approximately 4.5 W to approximately 15 W or approximately 5 W to approximately 10 W.

By the laser electromagnetic irradiation, formation of the metal cores from the non-conductive metal compound may be more preferably ensured, and the adhesion-activated surface including the same may be selectively formed on the predetermined region and exposed. However, the conditions of electromagnetic irradiation for metal core formation may vary depending on the specific type or the composition of the non-conductive metal compound and the polymer resin which are practically used.

Meanwhile, after the generating of the metal cores, as illustrated in the third figure of FIG. 2, the forming of the conductive metal layer by chemically reducing or plating the region generating metal cores may be carried out. As a result of the reducing or plating, the conductive metal layer may be selectively formed on the predetermined region exposing the metal core and the adhesion-activated surface, and on the other region, the chemically stable non-conductive metal compound maintains its non-conductivity. Therefore, the fine conductive pattern may be selectively formed only on the predetermined region of the polymer resin substrate.

In the reducing or plating, the predetermined region of the resin product or the resin layer which generates metal cores may be treated with an acidic or basic solution containing a reducing agent, and this solution may contain one or more selected from the group consisting of formaldehyde, hypophosphite, dimethylamino borane (DMAB), diethylaminoborane (DEAB) and hydrazine as the reducing agent. In another embodiment, the region may be treated with an electroless plating solution containing the reducing agent and conductive metal ions in the reducing.

As the reducing or plating is carried out, the first metal, second metal or third metal ions included in the metal core are reduced, or the conductive metal ions in the plating solution are chemically reduced in the region where the metal cores are formed as a seed, and therefore, an excellent conductive pattern may be selectively formed on the predetermined region. In this regard, the metal core and the adhesion-activated surface may form a strong bond with chemically reduced conductive metal ions, and as a result, the conductive pattern may be more easily formed selectively on the predetermined region.

Meanwhile, according to still another embodiment, provided is a resin structure having the conductive pattern which is obtained by using the composition for forming the conductive pattern and the method of forming the conductive pattern described above. The resin structure may include the polymer resin substrate; the non-conductive metal compound that includes the first metal, the second metal, and the third metal, and is dispersed in the polymer resin substrate, the non-conductive metal compound having a three-dimensional structure including a plurality of first layers (edge-shared octahedral layer) that includes two metals of the first metal, the second metal, and the third metal and has edge-shared octahedrons two-dimensionally connected to each other, and a second layer that includes a metal different from that of the first layer and is arranged between the neighboring first layers; the adhesion-activated surface having a metal core including the first metal, second metal or third metal, or the ion thereof which is exposed on the surface of the predetermined region of the polymer resin substrate; and the conductive metal layer formed on the adhesion-activated surface.

In the resin structure, the predetermined region where the adhesion-activated surface and the conductive metal layer are formed may correspond to the region of the polymer resin substrate to which the electromagnetic wave is irradiated. In addition, the first metal, second metal or third metal or the ion thereof included in the metal cores of the adhesion-activated surface may be derived from the non-conductive metal compound. Meanwhile, the conductive metal layer may be derived from the first metal, second metal or third metal or from the conductive metal ion included in the electroless plating solution.

Meanwhile, the resin structure may further include residues which are derived from the non-conductive metal compound dispersed in the polymer resin substrate. These residues may have a structure in which the first metal, second metal or third metal is at least partially released from the three-dimensional structure of the non-conductive metal compound, and therefore, vacancy is formed in at least one portion of the compound.

The above-described resin structure may be applied to a variety of resin products or resin layers such as an electronic device case having the conductive pattern, or to a variety of resin products or resin layers having the conductive pattern, such as antenna, RFID tags, various sensors, or MEMS structure.

Figure 4:
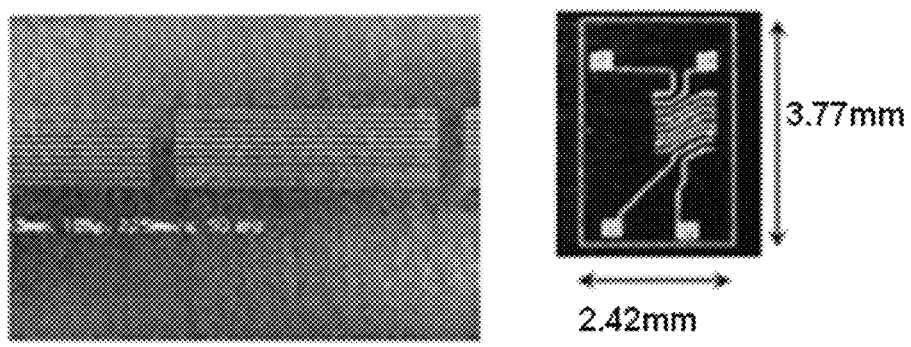
FIG. 4 is an image showing formation of a conductive pattern on a polymer resin substrate according to a method of forming a conductive pattern according to another embodiment of the present invention.

As described above, according to embodiments of the present invention, a variety of resin products having fine conductive patterns may be easily formed by a very simple method of including laser electromagnetic irradiation and reduction or plating. One example of the fine conductive pattern which is formed on the resin product or the resin layer is illustrated in FIG. 4. As supported by FIG. 4, the fine conductive pattern may be easily formed on a variety of the resin products or the resin layers by the very simple method as described above, and thus the present invention greatly contributes to development of resin products having many forms, including novel resin products which have been never proposed.

Hereinafter, actions and effects of the present invention will be described in more detail with reference to specific Examples of the present invention. However, these Examples are provided only for illustrative purposes and are not intended to limit the scope of the present invention.

PREPARATION EXAMPLE 1

Synthesis of Non-Conductive Metal Compound $Cu_3(NiV_2)O_6$

Raw materials, Cu, NiO, and $V_2O_5$ were mixed homogeneously at a molar ratio of 3:1:1, and then pelletized. Then, a pellet was inserted into a fumed silica tube, and sealed under vacuum.

Figure 5:
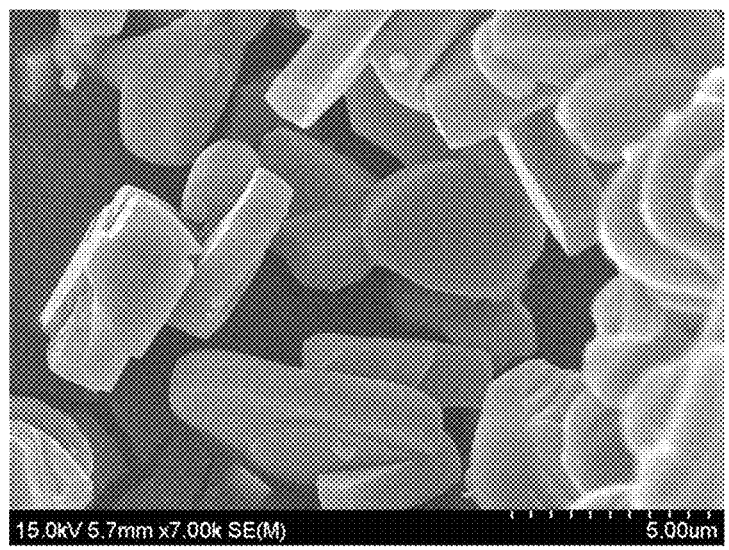
FIGS. 5 and 6 show an electron microscopic image and X-ray diffraction pattern of $Cu_3(NiV_2)O_6$ powder synthesized in Preparation Example 1, before pulverization, respectively.
Figure 6:
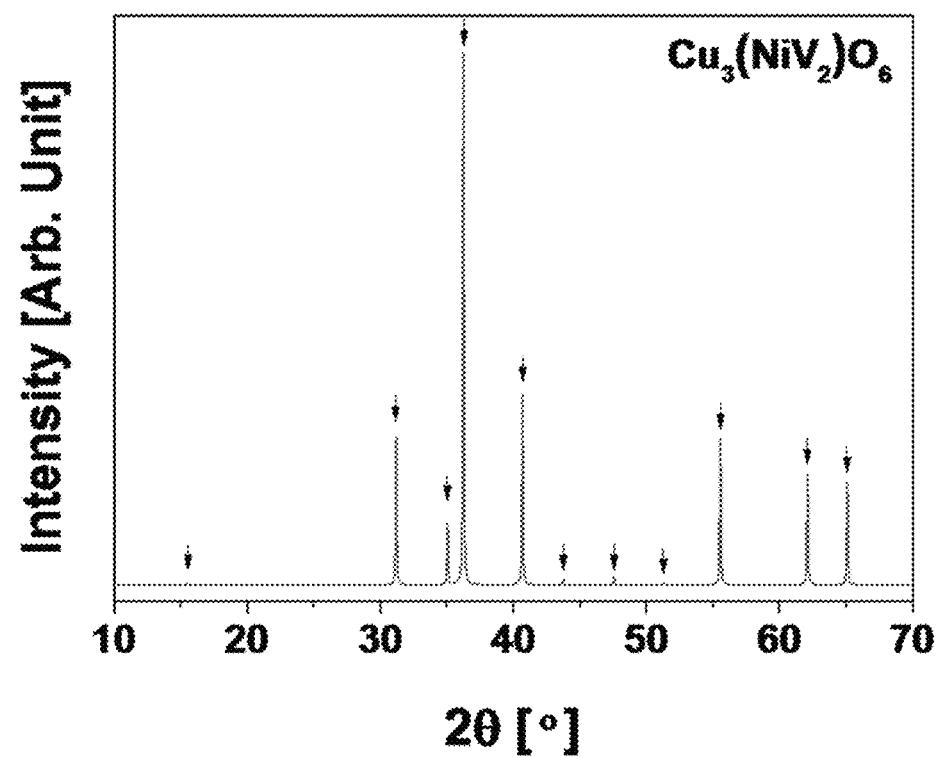

The sample thus sealed was calcined for 24 hours at 650° C. to prepare a powder having Chemical Formula of $Cu_3(NiV_2)O_6$. An electron microscopic image and X-ray diffraction pattern of the powder thus prepared are shown in FIGS. 5 and 6, respectively. The electron microscopic image and X-ray diffraction pattern show that the non-conductive metal compound has a plate-type crystal structure, and has a layered three-dimensional structure as shown in FIG. 1.

Figure 7:
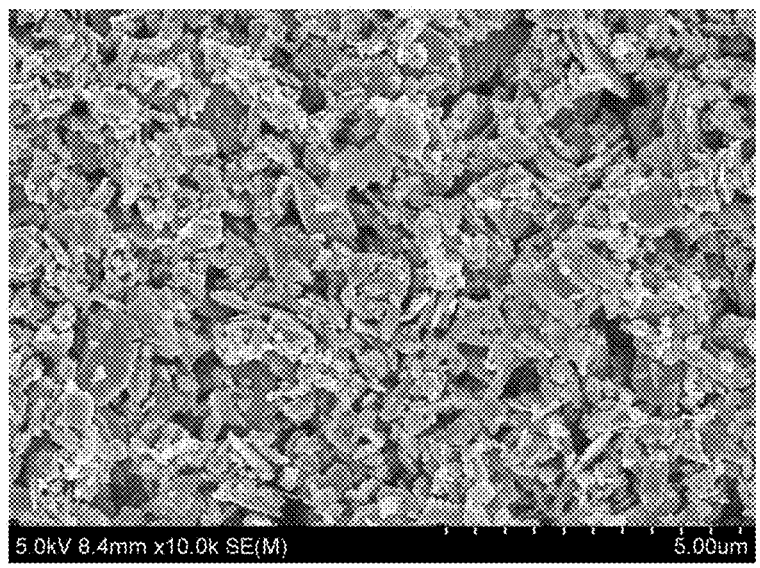
FIG. 7 shows an electron microscopic image of $Cu_3(NiV_2)O_6$ powder obtained after particle size control in Preparation Example 1.

The prepared powder was additionally pulverized and particulated to have a mean particle size ($D_{50}$) of approximately 500 nm and a particle size distribution of approximately 0.1 to 1.2 µm. The pulverized $Cu_3(NiV_2)O_6$ powder was used in the following Examples, and an electron microscopic image of the pulverized powder is shown in FIG. 7.

EXAMPLE 1

Formation of Conductive Pattern by Direct Laser Irradiation

A polycarbonate resin as a basic resin and the non-conductive metal compound powder [$Cu_3(NiV_2)O_6$] obtained in Preparation Example 1 were used, and additives for processing and stabilization were also used to prepare a composition for forming a conductive pattern by electromagnetic irradiation.

A heat stabilizer (IR1076, PEP36), a UV stabilizer (UV329), a lubricant (EP184), and an impact modifier (S2001) were used as the additives.

The non-conductive metal compound of 5% by weight, the impact modifier of 4% by weight, and other additives including the lubricant of 1% by weight were mixed with the polycarbonate resin, based on the total composition, so as to obtain a composition, and the composition was blended and extruded in an extruder at 260° C. to 280° C. to give a pellet-type resin composition. The pellet-type resin composition thus extruded was subjected to injection-molding at approximately 260° C. to approximately 280° C. to give a substrate having a diameter of 100 mm and a thickness of 2 mm.

Figure 8:
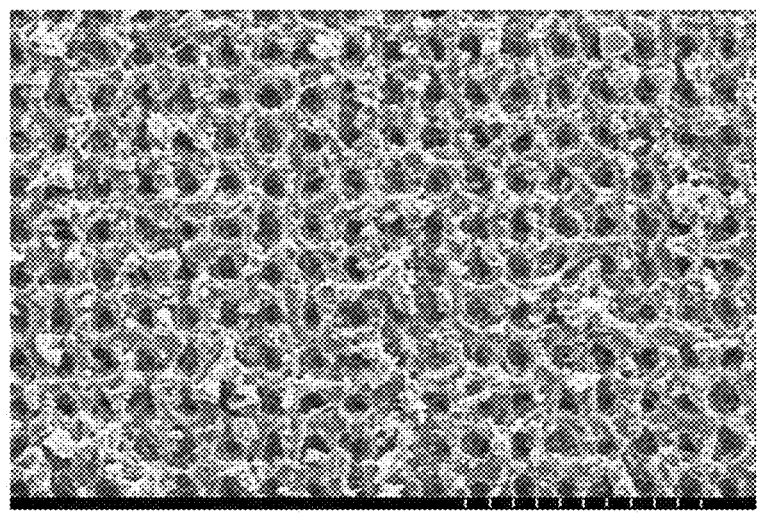
FIG. 8 shows an electron microscopic image of the surface of a resin structure formed by laser irradiation, after obtaining the resin structure including $Cu_3(NiV_2)O_6$ powder in Example 1.
Figure 9:
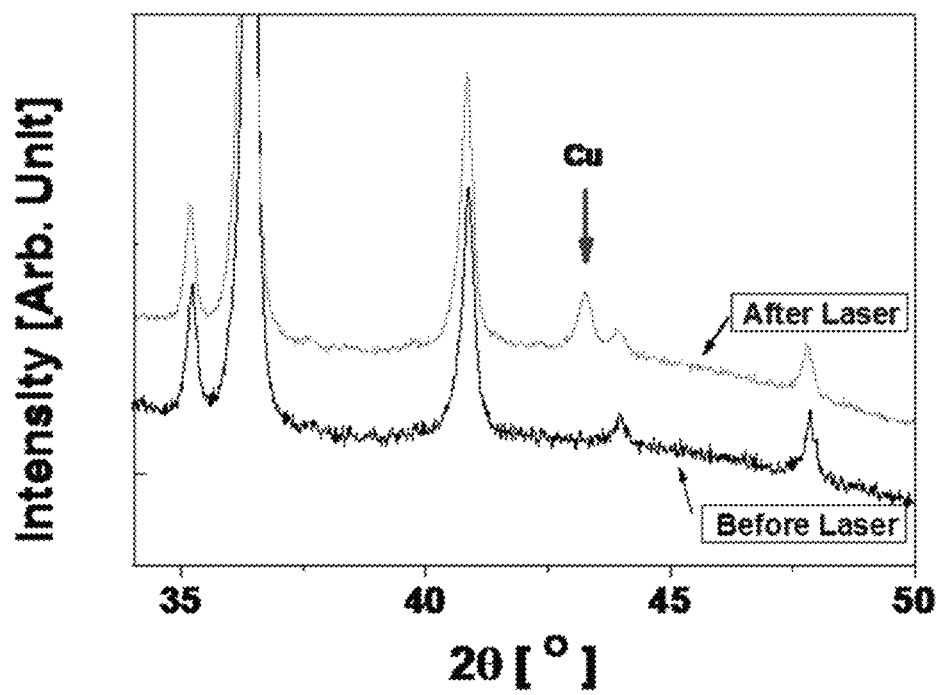
FIGS. 9 and 10 show X-ray diffraction analysis and an electron microscopic image to examine whether metal cores are formed on the resin structure after laser irradiation in Example 1, respectively.
Figure 10:
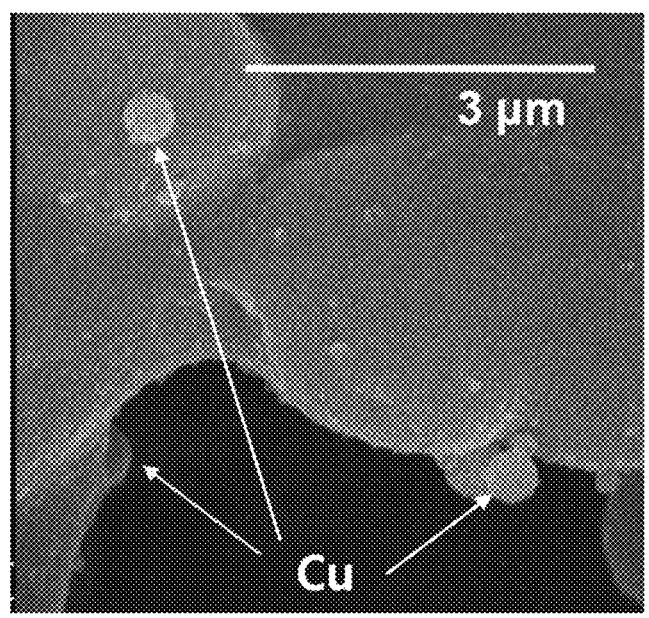

Meanwhile, the injection-molded, substrate-shaped resin structure was irradiated with laser having a wavelength of 1064 nm under the conditions of 40 kHz and 7 W using Nd-YAG laser to activate the surface. FIG. 8 shows an example of the surface condition of the resin substrate formed by laser irradiation. After laser irradiation, formation of the copper-containing metal cores in the resin structure was confirmed by XRD and electron microscopic images, and the results are shown in FIGS. 9 and 10, respectively. Referring to FIGS. 9 and 10, part of Cu or ion thereof derived from the $Cu_3(NiV_2)O_6$ particles was reduced after laser irradiation, leading to formation of metal seeds (namely, metal cores).

Subsequently, the resin structure of which surface was activated by laser irradiation was subjected to an electroless plating process as follows. The plating solution was prepared by dissolving 3 g of copper sulfate, 14 g of Rochelle salt, and 4 g of sodium hydroxide in 100 ml of deionized water. 1.6 ml of formaldehyde as a reducing agent was added to 40 ml of the plating solution thus prepared. The resin structure of which surface was activated by laser was immersed in the plating solution for 3 to 5 hours, and then washed with distilled water.

EXAMPLE 2

Formation of Conductive Pattern by Direct Laser Irradiation

A resin structure having a conductive pattern was manufactured in the same manner as in Example 1, except that the substrate-shaped resin structure injection-molded in Example 1 was irradiated with laser having a wavelength of 1064 nm under the conditions of 40 kHz and 5 W using Nd-YAG laser to activate the surface.

EXAMPLE 3

Formation of Conductive Pattern by Direct Laser Irradiation

A composition for forming a conductive pattern was prepared in the same manner as in Example 1, and a resin structure having the conductive pattern was manufactured therefrom, except that carbon black of 0.5% by weight was added to the composition for forming the conductive pattern of Example 1, based on the total composition.

EXAMPLE 4

Formation of Conductive Pattern by Direct Laser Irradiation

A composition for forming a conductive pattern was prepared in the same manner as in Example 1, and a resin structure having the conductive pattern was manufactured therefrom, except that $TiO_2$ of 5% by weight was further added to the composition for forming the conductive pattern of Example 1, based on the total composition.

COMPARATIVE EXAMPLE 1

Formation of Conductive Pattern by Direct Laser Irradiation

A composition for forming a conductive pattern was prepared in the same manner as in Example 1, and a resin structure having the conductive pattern was manufactured therefrom, except that $CuNiO_2$ was used as a non-conductive metal compound, instead of $Cu_3(NiV_2)O_6$.

The non-conductive metal compound $CuNiO_2$ of Comparative Example 1 showed lower laser sensitivity than those of Examples, and thus no metal seed derived from the non-conductive metal compound was formed.

Thereafter, plating was carried out to form a conductive pattern in the same manner as in Example 1, and then adhesion of the conductive pattern to the polycarbonate resin substrate and its integrity were measured and evaluated in the same manner as in Example 1 (see the following Experimental Example and Table 1). Accordingly, it was confirmed that a conductive pattern having poor adhesion was formed on the polycarbonate resin substrate in Comparative Example 1.

COMPARATIVE EXAMPLE 2

Formation of Conductive Pattern by Direct Laser Irradiation

A resin structure having a conductive pattern was manufactured in the same manner as in Example 1, except that the substrate-shaped resin structure injection-molded in Example 1 was irradiated with laser having a wavelength of 1064 nm under the conditions of 40 kHz and 3 W using Nd-YAG laser.

EXPERIMENTAL EXAMPLE

Evaluation of Adhesion Strength of Conductive Pattern

Conductive patterns were formed in Examples 1 to 4 and Comparative Examples 1 and 2, and then adhesion strengths thereof were evaluated by a cross-cut test according to the standard ISO 2409, and the results are shown in the following Table 1.

According to Table 1, the conductive pattern showing excellent adhesion strength to the polycarbonate resin was formed in Examples 1 to 4, whereas the conductive pattern with poor adhesion strength was formed in Comparative Example 1, and thus the conductive pattern was easily removed.

Further, it was confirmed that when the laser irradiation power was too weak as in Comparative Example 2, superior metal cores could not be formed from the non-conductive metal compound, and thus, a conductive pattern showing high adhesion strength was not provided.

TABLE 1

| | Example 1 | Example 2 | Example 3 | Example 4 | Comparative Example 1 | Comparative Example 2 |
|---|---|---|---|---|---|---|
| Polycarbonate resin [% by weight] | 90 | 90 | 89.5 | 85 | 90 | 90 |
| Non-conductive metal compound [% by weight] | 5 | 5 | 5 | 5 | 5 | 5 |
| Color additive (kind) [% by weight] | 0 | 0 | 0.5 (Carbon Black) | 5 (TiO$_2$) | 0 | 0 |
| Impact modifier [S2001, % by weight] | 4 | 4 | 4 | 4 | 4 | 4 |
| Other additive [% by weight] | 1 | 1 | 1 | 1 | 1 | 1 |
| Laser irradiation power [W, at 1064 nm] | 7 | 5 | 7 | 7 | 7 | 3 |
| Result of adhesion strength evaluation (ISO 2409 Class *) | 0 | 0 | 0 | 0 | 3 | 5 |

* in the adhesion strength evaluation according to the standard ISO 2409, Class 0 indicates that a delamination area of a conductive pattern is 0% of an area of a conductive pattern to be evaluated and Class 1 indicates that a delamination area of a conductive pattern is more than 0% to 5% or less of an area of a conductive pattern to be evaluated. Class 2 indicates that a delamination area of a conductive pattern is more than 5% to 15% or less of an area of a conductive pattern to be evaluated. Class 3 indicates that a delamination area of a conductive pattern is more than 15% to 35% or less of an area of a conductive pattern to be evaluated. Class 4 indicates that a delamination area of a conductive pattern is more than 35% to 65% or less of an area of a conductive pattern to be evaluated. Class 5 indicates that a delamination area of a conductive pattern is more than 65% of an area of a conductive pattern to be evaluated.

The invention claimed is:

1. A composition for forming a conductive pattern by electromagnetic irradiation, comprising:
   a polymer resin; and
   a non-conductive metal compound comprising a first metal, a second metal, and a third metal, the non-conductive metal compound having a three-dimensional structure comprising a plurality of first layers that comprises two metals of the first metal, the second metal, and the third metal and has edge-shared octahedrons two-dimensionally connected to each other, and a second layer that comprises a metal different from that of the first layer and is arranged between the neighboring first layers, wherein a metal core including the first metal, second metal, or third metal, or an ion thereof is formed from the non-conductive metal compound by electromagnetic irradiation.

2. The composition for forming the conductive pattern by electromagnetic irradiation of claim 1, wherein the metals comprised in the second layer of the non-conductive metal compound connect the two-dimensional structures to each other by connecting vertices of the octahedrons to each other between the neighboring first layers.

3. The composition for forming the conductive pattern by electromagnetic irradiation of claim 1, wherein the non-conductive metal compound has a space group of R$\bar{3}$m or P6$_3$/mmc.

4. The composition for forming the conductive pattern by electromagnetic irradiation of claim 1, wherein the non-conductive metal compound comprises a compound represented by the following Chemical Formula 1:

$$A_3(BC_2)X_6 \quad \text{[Chemical Formula 1]}$$

wherein A, B and C represent each independently the first metal, the second metal, and the third metal, A is one or more metals selected from the group consisting of Cu, Ag and Au, B is one or more metals selected from the group consisting of Ni, Co and Fe, C is V, and X is oxygen, nitrogen, or sulfur.

5. The composition for forming the conductive pattern by electromagnetic irradiation of claim 1, wherein the non-conductive metal compound comprises one or more compounds selected from the group consisting of Cu$_3$(NiV$_2$)O$_6$, Ag$_3$(NiV$_2$)O$_6$, Au$_3$(NiV$_2$)O$_6$, Cu$_3$(CoV$_2$)O$_6$, Cu$_3$(FeV$_2$)O$_6$, Ag$_3$(CoV$_2$)O$_6$, Ag$_3$(FeV$_2$)O$_6$, Au$_3$(CoV$_2$)O$_6$ and Au$_3$(FeV$_2$)O$_6$.

6. The composition for forming the conductive pattern by electromagnetic irradiation of claim 1, wherein the polymer resin comprises a thermosetting resin or a thermoplastic resin.

7. The composition for forming the conductive pattern by electromagnetic irradiation of claim 1, wherein the non-conductive metal compound is comprised in an amount of 1% by weight to 10% by weight, based on the total composition.

8. The composition for forming the conductive pattern by electromagnetic irradiation of claim 1, further comprising one or more additives selected from the group consisting of a heat stabilizer, a UV stabilizer, a flame retardant, a lubricant, an antioxidant, an inorganic filler, a color additive, an impact modifier, and a functional modifier.

9. A method of forming a conductive pattern by direct electromagnetic irradiation, the method comprising:
   molding the composition for forming the conductive pattern of claim 1 to a resin product or applying it to another product to form a resin layer;
   irradiating an electromagnetic wave to a predetermined region of the resin product or the resin layer to generate a metal core comprising the first metal, second metal, or third metal or the ion thereof from the non-conductive metal compound; and
   chemically reducing or plating the region generating the metal core to form a conductive metal layer.

10. The method of forming the conductive pattern by direct electromagnetic irradiation of claim 9, wherein in the generating of the metal core, a laser electromagnetic wave having a wavelength ranging from 200 nm to 11,000 nm is irradiated at an average power of 3 W to 20 W.

11. The method of forming the conductive pattern by direct electromagnetic irradiation of claim 9, wherein the conductive metal layer is formed on the adhesion-activated surface by chemical reduction of the first metal, second metal or third metal ions in the metal core, or by electroless plating thereof.

12. The method of forming the conductive pattern by direct electromagnetic irradiation of claim 9, wherein in the reducing or plating, a predetermined region on which the metal core is generated is treated with an acidic or basic solution comprising a reducing agent.

13. The method of forming the conductive pattern by direct electromagnetic irradiation of claim 12, wherein the reducing agent comprises one or more selected from the group consisting of formaldehyde, hypophosphite, dimethylamino borane (DMAB), diethylamino borane (DEAB), and hydrazine.

14. A resin structure having a conductive pattern, comprising:
  a polymer resin substrate;
  a non-conductive metal compound that comprises a first metal, a second metal, and a third metal, and is dispersed in the polymer resin substrate, the non-conductive metal compound having a three-dimensional structure comprising a plurality of first layers that comprises two metals of the first metal, the second metal, and the third metal and has edge-shared octahedrons two-dimensionally connected to each other, and a second layer that comprises a metal different from that of the first layer and is arranged between the neighboring first layers;
  an adhesion-activated surface having a metal core comprising the first metal, second metal or third metal, or the ion thereof which is exposed on the surface of the predetermined region of the polymer resin substrate; and
  a conductive metal layer formed on the adhesion-activated surface.

15. The resin structure having the conductive pattern of claim 14, wherein the predetermined region where the adhesion-activated surface and the conductive metal layer are formed corresponds to the region of the polymer resin substrate to which an electromagnetic wave is irradiated.

* * * * *